United States Patent [19]

Wada

[11] Patent Number: 4,571,705
[45] Date of Patent: Feb. 18, 1986

[54] NONVOLATILE SEMICONDUCTOR MEMORY DEVICE WITH ELECTRICALLY SELECTABLE, ERASABLE AND PROGRAMMABLE FUNCTION

[75] Inventor: Masashi Wada, Yokohama, Japan

[73] Assignee: Toyko Shibaura Denki Kabushiki Kaisha, Kawasaki, Japan

[21] Appl. No.: 527,483

[22] Filed: Aug. 29, 1983

[30] Foreign Application Priority Data

Sep. 30, 1982 [JP] Japan .................. 57-171381

[51] Int. Cl.⁴ .................... G11C 7/00; G11C 11/40
[52] U.S. Cl. .......................... 365/195; 365/184; 365/233; 357/23.5
[58] Field of Search ............... 365/195, 194, 203, 185, 365/184, 189, 233; 357/23.5

[56] References Cited

U.S. PATENT DOCUMENTS

| | | | |
|---|---|---|---|
| 3,728,695 | 4/1973 | Frohman-Bentchkowsky | 365/185 |
| 4,110,842 | 8/1978 | Sarkissian et al. | 365/233 |
| 4,314,265 | 2/1982 | Simko | 365/185 |
| 4,334,292 | 6/1982 | Kotecha | 357/23.5 |
| 4,344,154 | 8/1982 | Klaas et al. | 365/194 |
| 4,377,857 | 3/1983 | Tickle | 365/185 |
| 4,393,481 | 7/1983 | Owen et al. | 365/185 |
| 4,398,269 | 8/1983 | Hedin et al. | 365/184 |

FOREIGN PATENT DOCUMENTS 0150045 11/1979 Japan ........................ 365/203

*Primary Examiner*—Stuart N. Hecker
*Assistant Examiner*—Glenn A. Gossage
*Attorney, Agent, or Firm*—Oblon, Fisher, Spivak, McClelland & Maier

[57] ABSTRACT

A nonvolatile semiconductor memory device has a memory cell array including a MOS FET with a floating gate, first and second control gates and a program electrode; column and row decoders for selecting a specific memory cell; a program control circuit for programming data on the floating gate; and a timing circuit for providing operation timings of the column and row decoders and the program control circuit. The timing circuit sets up a program inhibit period ranging over time point at which a selected memory cell is to be erased and programmed. In the program inhibit period, one of the first and second control gates of each of the memory cells is at a high potential, while the other control gate is at low potential.

6 Claims, 11 Drawing Figures

F I G. 7
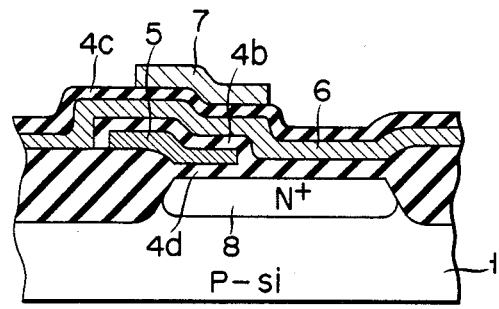
F I G. 8
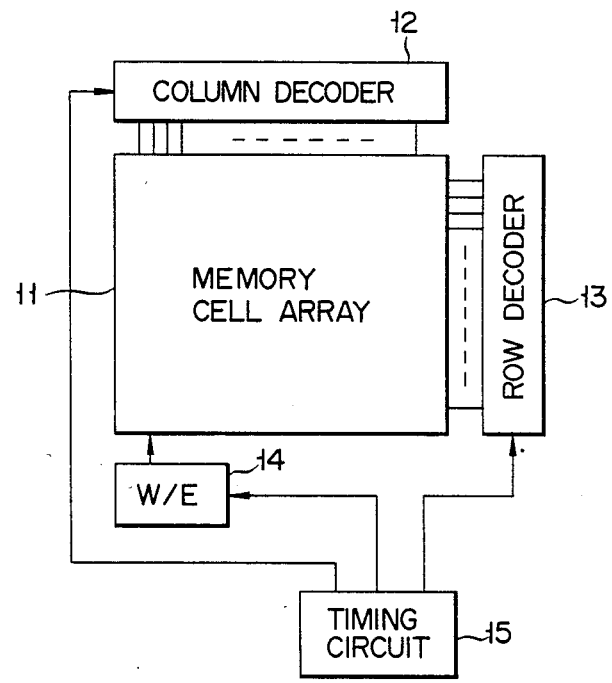

NONVOLATILE SEMICONDUCTOR MEMORY DEVICE WITH ELECTRICALLY SELECTABLE, ERASABLE AND PROGRAMMABLE FUNCTION

BACKGROUND OF THE INVENTION

This invention relates to a nonvolatile semiconductor memory device which is electrically selectable, erasable and programmable.

There has been known a MOS FET type memory cell with a floating gate and a control gate, as shown in FIG. 1. In a semiconductor memory device with a matrix array containing this type of memory cells, data is electrically selectable, erasable and programmable. Each memory cell has a source S and a drain D which are formed on the semiconductor substrate, a floating gate FG formed on a channel region between the source S and the drain D, first and second control gates CG1 and CG2 capacitance-coupled with the floating gate FG, and a program electrode EG for programming the data at the floating gate. The program electrode EG opposes the floating gate FG with a very thin insulating film interposed therebetween to allow a tunnel current to flow.

A matrix array of the memory cells of this type, i.e., 4-bit memory, is shown in FIG. 2. Memory cells M1–M4 are so connected that the drains and the first control gates in the same column are interconnected, respectively, the second control gates in the same row are interconnected, and the sources S and the electrodes EG of all the memory cells are interconnected.

The selective read and write operations of the memory device described above will be described. The memory device is of the N-channel MOS FET type. To access the memory cell M1, the drain D1 and the second control gate CG21 are set at high potential, while the remaining electrodes are set at low potential. When the memory cell M1 is logical "1", a channel current flows into the memory cell M1. When it is logical "0", no channel current flows into this memory cell. The memory cell M1 is in the logical "1" state when no charge is written in the floating gate FG; it is in the logical "0" state when electrons are injected in the floating gate FG and the threshold voltage Vt1 is high and positive. To program or write the contents of the memory cell M1, the first and second gates CG11 and CG21 are set at high potential, while the remaining terminals are set at low potential. In the memory cell M1 only, the potential at the floating gate FG is sufficiently higher than that at the program electrode EG. Alternatively, the first and second control gates CG11 and CG21 are set at low potential, while the remaining terminals are set at high potential to erase the contents of the memory cell M1. In this case, in the memory cell M1 only, the potential at the gate FG is sufficiently lower than that at the electrode EG. Therefore, a tunnel current flows between the floating gate FG and the program electrode EG, thus programming the memory cell M1.

As illustrated in FIG. 3, the potentials at the first and second control gates CG1 and CG2 and the program electrode EG concurrently change at the program start time point $t_o$.

Since the memory cells are arranged as shown in FIG. 1, the nonvolatile semiconductor memory device is electrically selectable, erasable and programmable. However, the memory device involves the following problems. The potentials at the electrodes and gates of the memory cells are externally controlled, and some time delay is inevitable in transferring signals for such potential control. Therefore, it is difficult to obtain the ideal and simultaneous potential changes as shown in FIG. 3. The first and second control gates CG1 and CG2 are at high potential and the program electrode EG is at low potential. Alternatively, the first and second control gates CG1 and CG2 are at low potential and the program electrode EG is at high potential. In either case, undesirable change of the contents of the memory cells may occur.

SUMMARY OF THE INVENTION

Accordingly, the object of the present invention is to provide a nonvolatile semiconductor memory device which can be electrically selectable, erasable and programmable and in which the contents of the memory cells other than the selected do not change.

This and other objects of the invention have been attained by the nonvolatile semiconductor memory device electrically selectable, erasable and programmable functions, which comprises a plurality of memory cells arranged in rows and columns, each of the memory cells including a source and a drain separately formed on the semiconductor substrate, a floating gate formed on an insulating film formed on a channel region between the source and drain, a program electrode opposing the floating gate with a very thin insulation film interposed therebetween, and first and second control gates formed in a capacitance-coupled manner on an insulation film formed on the floating gate, the first control gates of the memory cells of each column being connected to one another and the second control gates of the memory cells of each row being connected to one another; select circuit for properly selecting memory cell by setting a potential relation between the first and second control gates; and timing circuit for providing a program inhibition period ranging over a period including a time point at which a program potential for programming the contents in the memory cell selected by the select circuit is supplied to the program electrode, the timing means keeping one of the first and second control gates of any memory cell at high potential during the program inhibition period, while keeping the other of the control gates thereof at low potential.

According to this invention, even if timings for setting potentials at the electrode and gates of a memory cell to program shifts slightly, the contents of only this memory cell can be changed without changing the contents of the remaining memory cells. Therefore, the nonvolatile semiconductor memory device according to this invention is reliable.

BRIEF DESCRIPTION OF THE DRAWINGS

Other objects and advantages of the invention will be apparent from the following description taken in conjunction with the accompanying drawings, in which:

FIG. 7 is a cross sectional view taken on line VII—VII of FIG. 4;

FIG. 8 is a block diagram of a nonvolatile semiconductor memory device according to this invention;

DETAILED DESCRIPTION OF THE PREFERRED EMBODIMENTS

Figure 1:
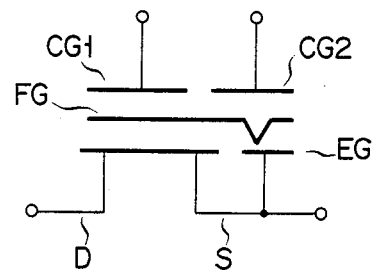
FIG. 1 shows an equivalent circuit of a MOS FET with a floating gate, first and second control gates and a program electrode.
Figure 2:
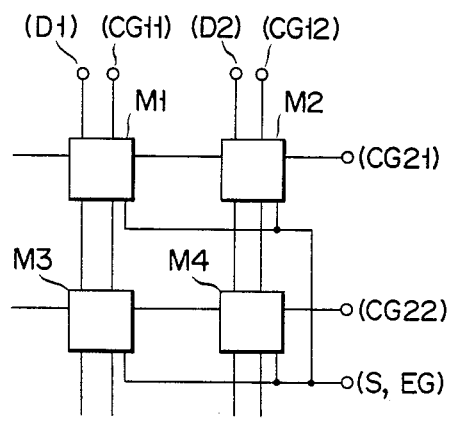
FIG. 2 shows a 4-bit memory cell array using MOS FETs shown in FIG. 1.

An embodiment of the present invention will be described, referring to the accompanying drawings. FIGS. 4 to 7 show a nonvolatile semiconductor memory device according to the present invention. A source 2 and a drain 3, both being of N+ type, are fabricated in the surface region of a P type silicon substrate 1. A gate insulation layer 4a is formed on a channel region located between the source 2 and the drain 3. A floating gate 5 is formed on this gate insulation layer 4a. A first control gate 6 and a second control gate 7 are formed above the floating gate 5 in a capacitance-coupled manner. A gate insulating film 4b is interposed between the gate 5 and the first control gate 6, and a gate insulating film 4c is interposed between the gate 5 and the second control gate 7. An N+ layer 8, i.e., a program electrode formed integrally with the source 2, is located adjacent to the channel region. The floating gate 5 extends over the N+ layer 8 and opposes the N+ layer 8 with a very thin insulating film 4d interposed therebetween. The first control gate 6, i.e., a program control electrode, extends in the column direction of a memory matrix. The second control gate 7 used for the program control and for a read gate and the floating gate 5 cover the channel region. The gate 7 extends in the row direction of the memory matrix. In the matrix memory array, the source 2 continuously extends in the row direction, while the drains 3 are connected by a metal interconnection wire extending in the column direction.

A nonvolatile semiconductor memory device using the matrix memory array 11 described above is schematically illustrated in FIG. 8. A column decoder 12 is used to control the potential on the first control gate 6; a row decoder 13 to control the potential on the second control gate 7; a write/erase (W/E) control circuit 14 to apply a high potential of 20 V, for example, or a low potential of 0 V, for example, to all N+ layer 8 of each memory cell. A timing circuit 15 is provided to control the potentials on the column decoder 12, row decoder 13 and W/E control circuit 14.

Figure 3:
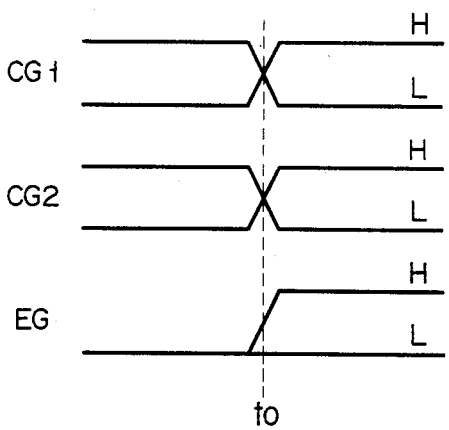
FIG. 3 shows a timing diagram explaining the selective programming operation of a conventional semiconductor memory device using the memory cell array of FIG. 2.
Figure 4:
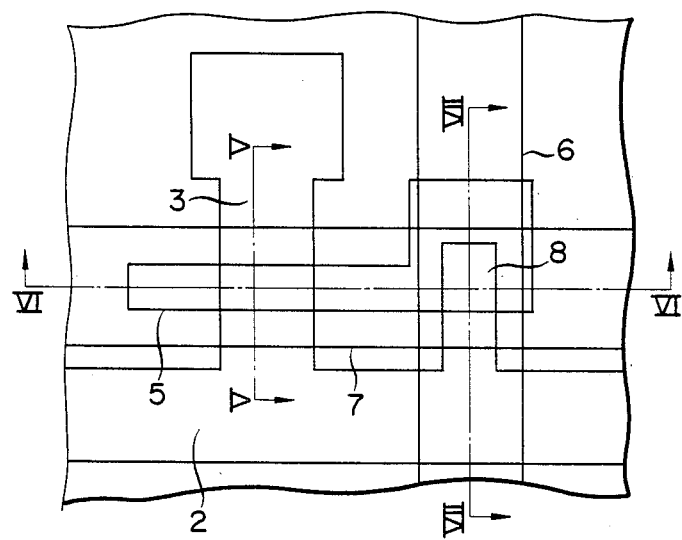
FIG. 4 is a plan view of a MOS FET with a floating gate, first and second control gates, and a program electrode.
Figure 5:
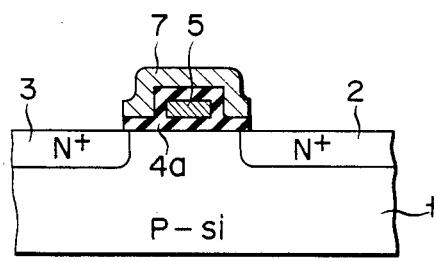
FIG. 5 is a cross sectional view taken on line V—V of FIG. 4.
Figure 6:
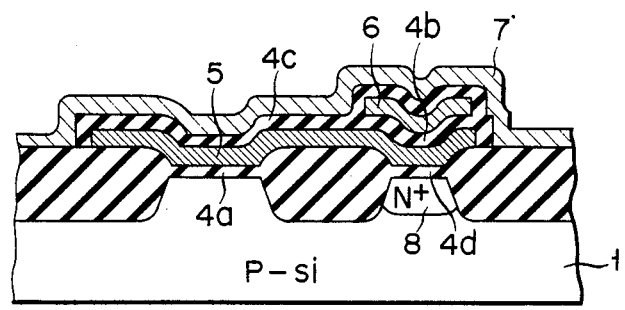
FIG. 6 is a cross sectional view taken on line VI—VI of FIG. 4.

The operation of the nonvolatile semiconductor memory device in a program mode will be described, referring to FIG. 9. At time t2 (corresponding to $t_0$ in FIG. 3) data is to be programmed. Before and after the program point t2 is program inhibit period T, from time t1 to time t3, which extends over time t2. In response to a control signal from the timing circuit 15, all outputs of the column decoder 12 are set at low potential, while all outputs of the row decoder 13 are set at high potential. In any memory cells of the matrix array, the first control gate 6 and the second control gate 7 are set at low potential and high potential, respectivey. Under this condition, at time t2, the W/E control circuit 14 supplies a program control signal of high potential to the N+ layer 8 in all memory cells. At time t2, the control gates 6 and 7 are not at high or low potential. Therefore, the data of the memory cell is not changed. At time t3, the column decoder 12 and the row decoder 13 produce the outputs for selecting a desired memory cell, to thereby program that memory cell. When the pulse impression time of the W/E control circuit 14 is 10 msec and a rise time of the pulse is several hundreds nsec to 1 $\mu$sec, several $\mu$sec is long enough for the program inhibit period T.

Figure 10:
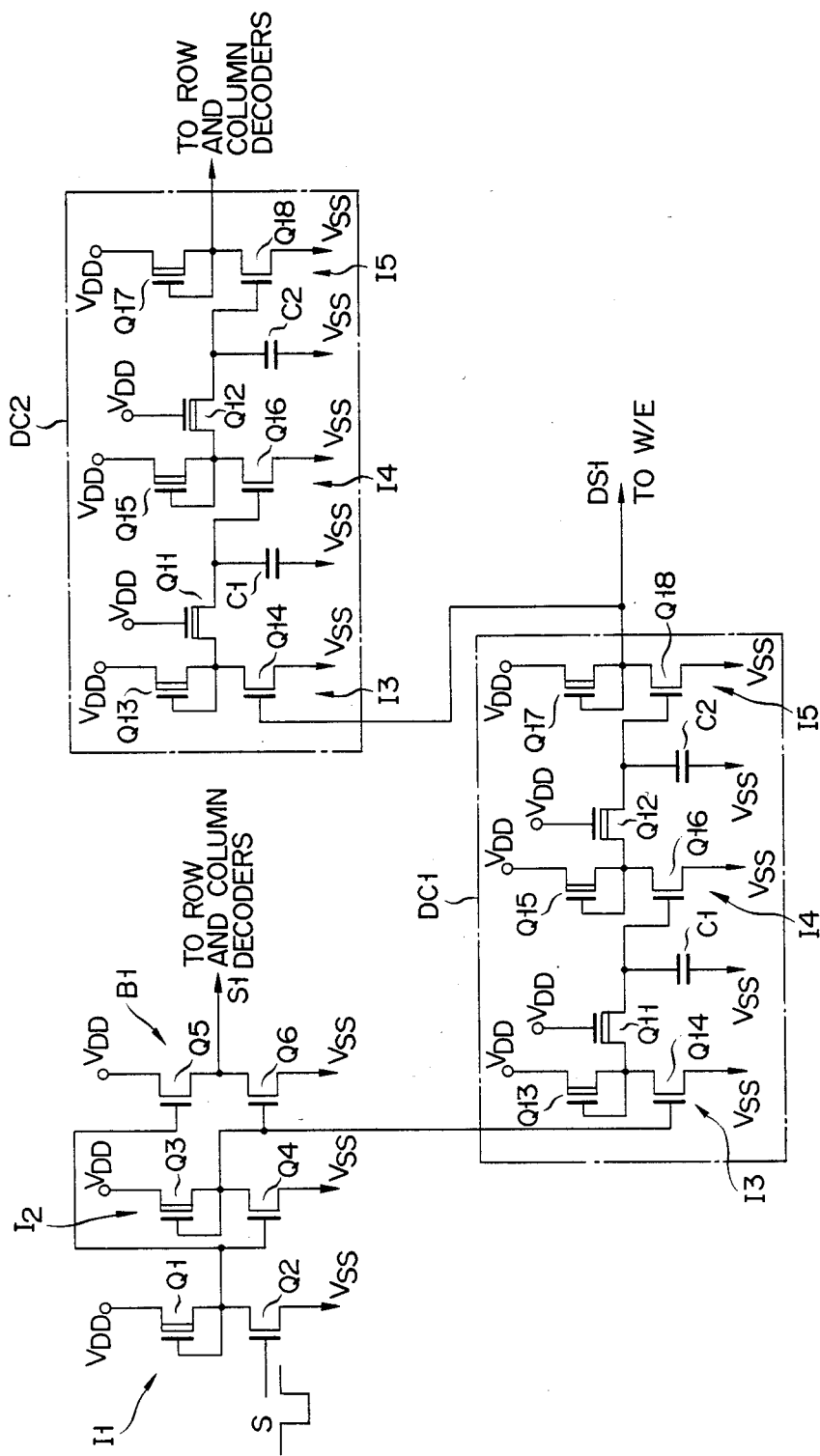
FIG. 10 is a circuit diagram of the timing circuit 15 shown in FIG. 8.

The actual structure of the timing circuit 15 is illustrated in FIG. 10. A timing signal S from this circuit 15 is applied to the row and column decoders, through inverters I1 and I2 connected in series and through a buffer B1. The inverter I1 is composed of a depletion mode MOS transistor Q1 and an enhancement mode MOS transistor Q2. The source-drain paths of these transistors Q1 and Q2 are connected to each other in series. The gate of the MOS transistor Q1 is connected to the source of the MOS transistor Q1. The inverter I2 is comprised of a depletion mode MOS transistor Q3 and an enhancement mode MOS transistor Q4. The source-drain paths of these transistors Q3 and Q4 are series-connected. The gate of the MOS transistor Q3 is connected to the source of the MOS transistor. The buffer B1 is comprised of enhancement mode MOS transistors Q5 and Q6 whose source-drain paths are series-connected to each other. The gate of the MOS transistor Q5 is supplied with the output of the inverter I1, and the gate of the MOS transistor Q6 with the output of the inverter I2. A timing signal S1 is produced from the node of the source-drain paths of the MOS transistors Q5 and Q6, and is applied to the row and column decoders. In response to the timing signal S1, all outputs of the column decoder 12 are set at low potential, while all outputs of the row decoder 13 are set at high potential.

The output signal of the inverter I2 is supplied to a first delay circuit DC1, which produces a first delay timing signal DS1 with a fixed time delay. The signal DS1 is applied to the W/E control circuit 14, which applies a high potential, for example, +20 V, to the N+ layers 8 of all memory cells. The first delay circuit DC1 is comprised of inverters I3 to I5, depletion mode MOS transistors Q11 and Q12, and capacitors C1 and C2. The inverter I3 is supplied with the output of the inverter I2. The output terminal of the inverter I3 is connected to the input terminal of the inverter I4 through the source-drain path of the MOS transistor Q11. The gate of the MOS transistor Q11 is connected to a power source $V_{DD}$. The output terminal of the inverter I4 is connected to the input terminal of the inverter I5 through the source-drain path of the MOS transistor Q12. The gate of the MOS transistor Q12 is connected to the power source $V_{DD}$. The input terminals of the inverters I4 and I5 are connected to a reference voltage source $V_{SS}$ via the capacitors C1 and C2, respectively. The inverter I3 is comprised of a depletion mode MOS transistor Q13 and an enhancement mode MOS transistor Q14. The inverter I4 is composed of a depletion mode MOS transistor Q15 and an enhancement mode MOS transistor Q16. The inverter I5 is comprised of a depletion mode MOS transistor Q17 and an enhancement mode MOS transistor Q18. The first delay timing signal DS1 is applied to the W/E control circuit 14, delayed a given time behind the timing signal S1.

The first delay timing signal DS1 is also supplied to a second delay circuit DC2, which produces a second delay timing signal DS2 further delayed a predetermined time. The signal DS2 is applied to the row and column decoders 12 and 13, which then produce output signals to select a desired memory cell. In response to these signals, the memory cell is selected and programmed. The second delay circuit DC2 is identical with the first delay circuit DC1 in structure. Like symbols are used to designate like or the same elements as these of the circuit DC1.

Figure 9:
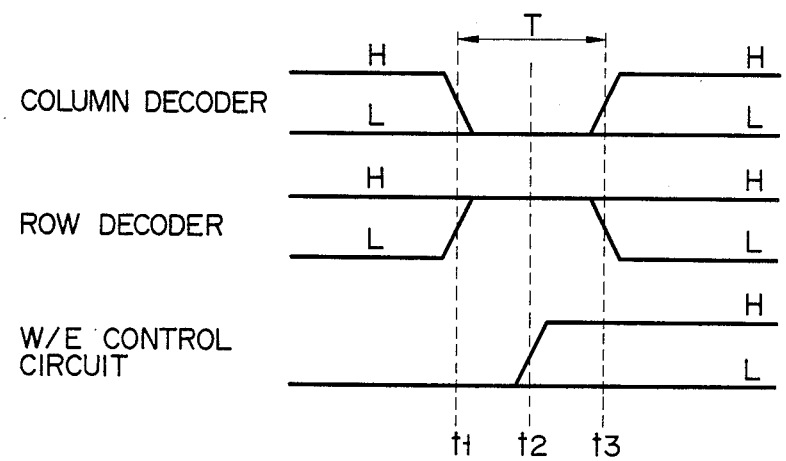
FIG. 9 is a timing diagram explaining a selective program operation of the nonvolatile semiconductor memory device of FIG. 8.
Figure 11:
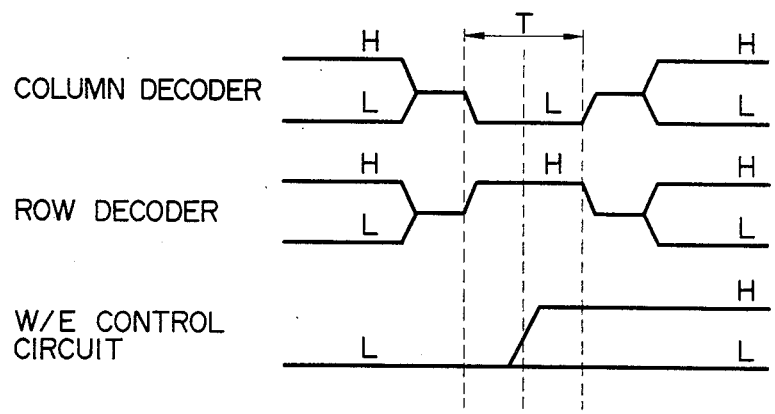
FIG. 11 is a timing diagram explaining another selective program operation of the nonvolatile semiconductor memory device of FIG. 8.

In FIG. 9, in the program inhibit period T, all outputs of the column decoder 12 are at low potential, while all outputs of the row decoder 13 are at high potential. Conversely, in the period T all outputs of the column decoder 12 are at high potential, while all of the outputs of the row decoder 13 are at low potential. Alternately, as shown in FIG. 11, a period for setting the outputs of the column and row decoders 12 and 13 at a medium level may extend over the program inhibit period T.

As described above, according to the present invention, the potential on the first and second control gates and the program electrode are nonconcurrently changed in programming the memory cell in the memory array. Specifically, the program inhibit period is provided for all the memory cells. In this period, one of the first and second control gates is at high potential while the other is at low potential. At the midpoint of the program inhibit period the programming potential is set. Therefore, only a desired memory cell is programmed without adversely affecting the remaining memory cells.

What is claimed is:

1. A nonvolatile semiconductor memory device with electrically selectable, erasable and programmable functions comprising:
   a plurality of memory cells arranged in a matrix array, each of said memory cells including a source and a drain separately formed in said semiconductor substrate, a floating gate formed on an insulating film formed on a channel region between said source and drain, a program electrode, and wherein said program electrode and said floating gate are stacked with a very thin insulation film interposed therebetween, and first and second control gates formed in a capacitance-coupled manner on an insulation film formed on said floating gate;
   said memory cells on each of column of said matrix arrayed memory cells having first control gates connected to one another, while said memory cells on each of row having second control gates connected to one another;
   select means for properly selecting predetermined memory cell by setting a potential relation between said first and second control gates; and
   timing means for providing a program inhibition period ranging over a period including the time point at which a program potential for programming the contents in the memory cell selected by said select means is supplied to said program electrode, said timing means keeping one of said first and second control gates of all memory cells at high potential during said program inhibition period, while keeping the other of said control gates at low potential.

2. A nonvolatile semiconductor memory device according to claim 1, wherein said program electrode is made of material of a high impurity concentration and formed to be integral with a source and adjacent to a channel region of a semiconductor substrate, said program electrode being of the same conductivity type as that of the source.

3. A nonvolatile semiconductor memory device according to claim 1, wherein said select means includes a column decoder connected to said first control gates, a row decoder connected to said second control gates, and a program control circuit for supplying a program control signal to said program electrode.

4. A nonvolatile semiconductor memory device according to claim 3, wherein said timing means comprises:
   timing signal generating means;
   means for receiving the timing signal from said timing signal generating means and applying said signal to said column and row decoders;
   first delay means for receiving the timing signal from said timing signal generating means, delaying said timing signal by a fixed time, and supplying a first delay timing signal to said program control circuit; and
   second delay means for receiving said first delay timing signal, delaying said first delay timing signal by a fixed time and supplying a second delay timing signal to said column and row decoders,
   whereby said program inhibition period is determined by said timing signal and second delay timing signal, and one of said first and second control gates is set at high potential and the other at low potential when the program potential is supplied to said program electrode in response to said first delay timing signal.

5. A nonvolatile semiconductor memory device according to claim 4, wherein said first delay means comprises:
   first to third inverters composed of MOS transistors, said first inverter receiving said timing signal, and said third inverter producing said first delay timing signal;
   a first depletion mode MOS transistor whose source-drain path is connected between the output terminal of said first inverter and the input terminal of said second inverter, the gate of said first depletion mode MOS transistor being supplied with a first reference potential;
   a first capacitor provided between the input terminal of said second inverter and a second reference potential;
   a second depletion mode MOS transistor whose source-drain path is connected between the output terminal of said second inverter and the input terminal of said third inverter, the gate of said second depletion mode MOS transistor being supplied with the first reference potential; and
   a second capacitor provided between the input terminal of said third inverter and said second reference potential.

6. A nonvolatile semiconductor memory device according to claim 4, wherein said second delay means comprises:
   first to third inverters composed of MOS transistors, said first inverter being supplied with said first delay timing signal and said third inverter producing said second delay timing signal;

a first depletion mode MOS transistor whose source-drain path is connected between the output terminal of said first inverter and the input terminal of said second inverter, the gate of said first depletion mode MOS transistor being supplied with a first reference potential;

a first capacitor provided between the input terminal of said second inverter and a second reference potential;

a second depletion mode MOS transistor whose source-drain path is connected between the output terminal of said second inverter and the input terminal of said third inverter, the gate of said second depletion mode MOS transistor being supplied with the first reference potential; and a second capacitor provided between the input terminal of said third inverter and a second reference potential.

* * * * *